US009048223B2

United States Patent
Kuo et al.

(10) Patent No.: US 9,048,223 B2
(45) Date of Patent: Jun. 2, 2015

(54) PACKAGE STRUCTURE HAVING SILICON THROUGH VIAS CONNECTED TO GROUND POTENTIAL

(71) Applicant: UNITED MICROELECTRONICS CORP., Hsinchu (TW)

(72) Inventors: Chien-Li Kuo, Hsinchu (TW); Yung-Chang Lin, Taichung (TW); Ming-Tse Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/016,330

(22) Filed: Sep. 3, 2013

(65) Prior Publication Data

US 2015/0061151 A1 Mar. 5, 2015

(51) Int. Cl.
| | |
|---|---|
| *H01L 23/02* | (2006.01) |
| *H01L 23/48* | (2006.01) |
| *H01L 23/00* | (2006.01) |
| *H01L 23/498* | (2006.01) |

(52) U.S. Cl.
CPC .............. *H01L 23/481* (2013.01); *H01L 24/73* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 23/49816* (2013.01); *H01L 23/49827* (2013.01)

(58) Field of Classification Search
CPC .............. H01L 2023/4031; H01L 2223/54486
USPC .................... 257/678–686, E23.061, E21.499
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |

(Continued)

*Primary Examiner* — Elias M Ullah
(74) *Attorney, Agent, or Firm* — WPAT, PC; Justin King

(57) ABSTRACT

A package structure having silicon through vias connected to ground potential is disclosed, comprising a first device, a second device and a conductive adhesive disposed between the first device and the second device. The first device comprises a substrate having a front surface and a back surface, and a plurality of through silicon vias filled with a conductor formed within the substrate. The first device is externally connected to the second device by wire bonding.

16 Claims, 3 Drawing Sheets

(56) References Cited

U.S. PATENT DOCUMENTS

| | | |
|---|---|---|
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin et al. |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Estes et al. |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 8,264,067 B2 | 9/2012 | Law |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2009/0302435 A1* | 12/2009 | Pagaila et al. ............... 257/659 |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |

\* cited by examiner

PACKAGE STRUCTURE HAVING SILICON THROUGH VIAS CONNECTED TO GROUND POTENTIAL

BACKGROUND OF THE INVENTION

1. Field of the Invention

The invention relates in general to a package structure having silicon through vias, and more particularly the package structure having silicon through vias filled with conductor connected to ground potential.

2. Description of the Related Art

Wire bonding chip packaging and Flip chip packaging are known chip interconnect technologies. Wire bonding chip microelectronic assembly is the electrical connection using face-up chips with a wire connection to each chip bond pad. In contrast, flip chip microelectronic assembly is the direct electrical connection of face-down (hence, "flipped") electronic components onto substrates, circuit boards, or carriers, by means of conductive bumps on the chip bond pads. Both processes offer advantages and disadvantages. For manufacturers, cost, performance and form factor have become the key drivers in selecting between wire bonding and flip-chip bonding as the interconnecting method of chip packaging. For example, the flip chip packaging with the die flipped over and placed face down provides the advantage of small form factor, but it is quite expansive to produce the flip chip packaging (ex: formation of conductive bumps connecting the die to a carrier). For the packaging typically with I/Os in the range of 100-600, the existing infrastructure, flexibility and materials/substrate costs of wire bonding chip packaging provide dominant advantages.

For the wire bonding chip packaging, the pads at the front side of the chips are typically grounded by bonding wires. This conventional grounding mechanism would raise issue of signal interference between the long wires, and may have considerable effect on the electrical performance of the device.

SUMMARY OF THE INVENTION

The disclosure is directed to a package structure having silicon through vias filled with conductor connected to ground potential, which improves the electrical performance of the package structure and keeps the cost of production in the acceptable level.

According to an aspect of the present disclosure, a package structure having silicon through vias connected to ground potential is disclosed. The package structure comprises a first device, a second device and a conductive adhesive disposed between the first device and the second device. The first device comprises a substrate having a front surface and a back surface, and a plurality of through silicon vias filled with a conductor formed within the substrate. The first device is externally connected to the second device by wire bonding.

The disclosure will become apparent from the following detailed description of the preferred but non-limiting embodiments. The following description is made with reference to the accompanying drawings.

DETAILED DESCRIPTION OF THE INVENTION

Figure 1:
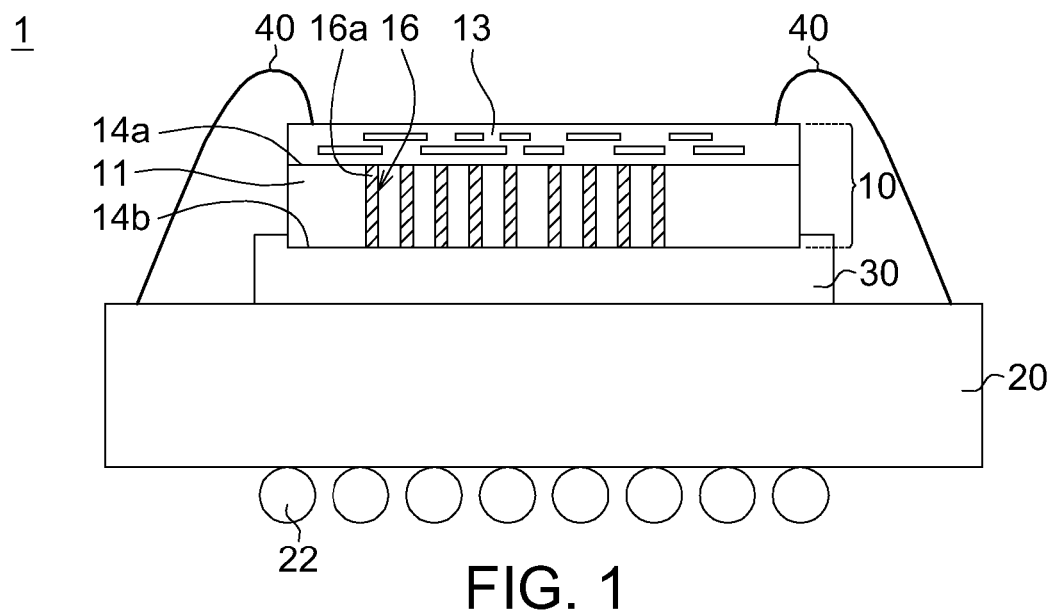
FIG. 1 schematically illustrates a package structure having TSVs connected to ground potential according to the first embodiment of the disclosure.

According to the embodiments of the disclosure, a package structure with through silicon vias (TSV) filled with conductor connected to ground potential is provided, thereby improving electrical performance and keeping acceptable cost of production. The embodiments are described in details with reference to the accompanying drawings; however, the illustrations may not necessarily be drawn to scale. The details of the structures of the embodiments are provided for exemplification only, not for limiting the scope of protection of the disclosure; and there may be other embodiments of the present disclosure which are not specifically illustrated. Moreover, secondary elements are omitted in the disclosure of the embodiment for highlighting the technical features of the disclosure. Thus, the specification and the drawings are to be regard as an illustrative sense rather than a restrictive sense.

According to the embodiments, a package structure comprises a first device wire bonded to a second device, and the first device comprising a substrate having plural through silicon vias (TSVs) filled with conductor formed within the substrate for connecting to ground potential. Also, a conductive adhesive (such as conductive die attach film (DAF)) is disposed between the first and second devices.

Several embodiments are provided hereinafter with reference to the accompanying drawings for describing the related structures, but the present disclosure is not limited thereto. The similar or identical elements of the embodiment are designated with the similar or same reference numerals. It is noted that not all embodiments of the invention are shown. Modifications and variations can be made without departing from the spirit of the disclosure to meet the requirements of the practical applications.

First Embodiment

FIG. 1 schematically illustrates a package structure having TSVs connected to ground potential according to the first embodiment of the disclosure. A package structure 1 comprises a first device 10, a second device 20 and a conductive adhesive 30 disposed between the first device and the second device. The first device 10 comprises a substrate 11 having a front surface 14a (with an active layer 13 formed thereon) and a back surface 14b, and plural through silicon vias (TSVs) 16 filled with conductor 16a formed within the substrate 11 for connecting to grounding potential. Also, the package structure 1 further comprises plural wires 40, and the first device 10 is externally wire-bonded to the second device 20 by the wires. As shown in FIG. 1, the first device 10 is electrically connected to the second device 20 by wire bonding the front side of the first device 10 to the second device 20.

The conductive adhesive 30, such as a conductive die attach film (DAF), is disposed between the first device 10 and the second device 20, and the first device 10 of the embodiment could be attached to the second device 20 via the conductive adhesive 30. In the first embodiment, the conductive adhesive 30 is attached to the back surface 14b of the first device 10, and the conductive adhesive 30 at least electrically preferably physically contacts the conductor 16a filled in the through silicon vias 16, as shown in FIG. 1.

Also, configurations and types of the first device 10 and the second device 20 could be varied and selected depending on the structural requirements of practical applications. In one embodiment, the first device 10 could be a die/chip with or without the active elements, and the die/chip could comprise a silicon substrate and a signal routing of the active layer 13 (ex: a thinned dielectric layer (ILD) containing routing traces formed on the front surface of the silicon substrate). In one embodiment, the silicon substrate of the embodiment may have a sufficient thickness for supporting the thinned die/chip.

The second device 20 of the embodiment could be an organic substrate with or without die/chip thereon. The second device 20 of the embodiment could be another chip, an interposer or a printed circuit board (PCB). For example, the second device 20 of the embodiment could be an interposer for carrying one or more chips (ex: carrying one or at least two first devices 10), and the second device 20 is further coupled to a PCB (not shown in FIG. 1) such as by the solder bumps 22.

Compared to the conventional grounding mechanism of the chip (i.e., the pads at the front side of the chips being grounded by bonding wires (wire bond interconnect), or solder balls (flip-chip interconnect)), which has an issue of signal interference between the long wires, the package structure of the embodiment adopts conductive TSVs 16 in the substrate 11 to connect to grounding potential do effectively solve the problem of signal interference caused by long wires, thereby improving electrical performance. Also, this novel scheme of the package structure according to the embodiment keeps the cost of production in an acceptable level.

Second Embodiment

Figure 2:
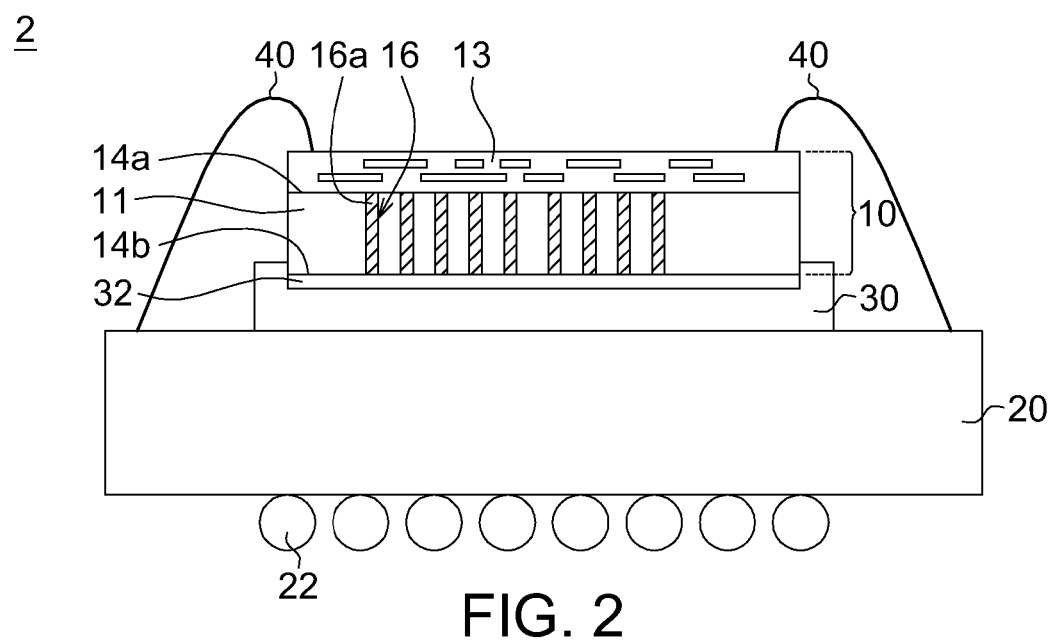
FIG. 2 schematically illustrates a package structure having TSVs connected to ground potential according to the second embodiment of the disclosure.

FIG. 2 schematically illustrates a package structure having TSVs connected to ground potential according to the second embodiment of the disclosure. The difference between the package structure of the second embodiment and the package structure of the first embodiment is addition of a conductive layer, such as a metal layer, between the first device 10 and the conductive adhesive 30.

As shown in FIG. 1, the conductive adhesive 30 of the first embodiment is formed on the back surface 14b of the first device 10, so as to electrically or physically contact the conductor 16a in the through silicon vias 16 (without the metal layer 32). According to the first embodiment, the electrical current passes the conductor 16a in the through silicon vias 16, the conductive adhesive 30, and reaches the grounding node (not depicted) of the second device 20.

Alternatively, the package structure 2 according to the second embodiment further comprises a metal layer 32 (such as a backside metal) disposed at the back surface 14b of the first device 10, and the conductive adhesive 30 is disposed in contact with the metal layer 32, as shown in FIG. 2. According to the second embodiment, the electrical current passes the conductor 16a in the through silicon vias 16, the metal layer 32, the conductive adhesive 30, and reaches the grounding node (not depicted) of the second device 20. The grounding effect might be increased due to the addition of the metal layer 32. Also, the metal layer 32 formed at the back surface 14b of the first device 10 provide an even surface for coating/forming the conductive adhesive 30. Therefore, the coating/forming procedure of the conductive adhesive 30 could be easily performed, and the adhesion reliability between the first device 10 and the second device 20 could be enhanced.

Third Embodiment

In the applications of present disclosure, the chips with different configurations could be applied in the package structure of the embodiment. For example, a chip with via-middle TSVs fabricated by a via-middle approach, or a chip with via-first TSVs fabricated by a via-first approach could be adopted as the first device of the package structure of the embodiment. The chips with different configurations in application are illustrated below. It is, of course, understood that these configurations are merely for demonstrating applicable structures, and not for limiting the disclosure.

Figure 3:
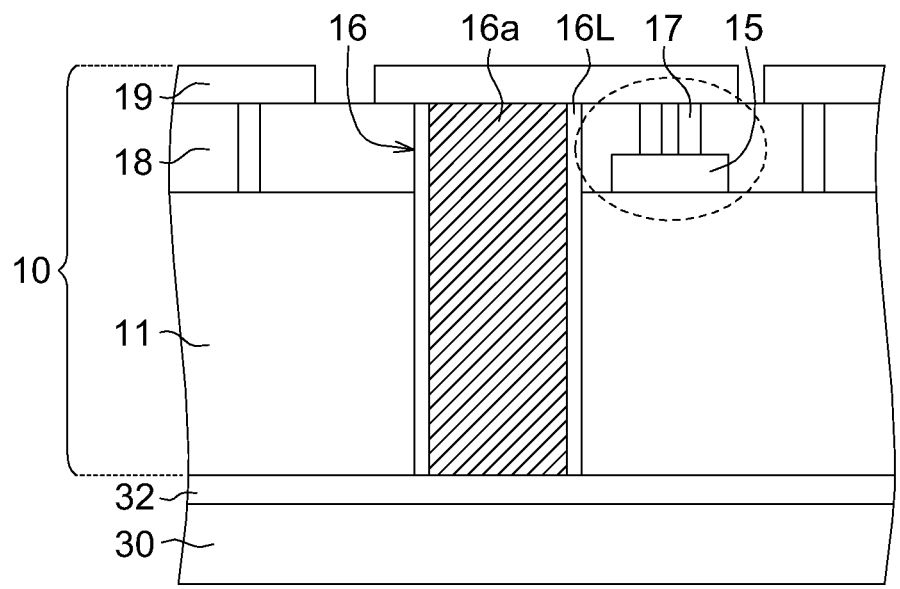
FIG. 3 schematically illustrates a portion of a package structure having a chip with via-middle TSVs according to the third embodiment of the disclosure.

FIG. 3 schematically illustrates a portion of a package structure having a chip with via-middle TSVs according to the third embodiment of the disclosure. In FIG. 3, a chip with via-middle TSVs (fabricated by a via-middle approach) is taken for exemplifying a first device in the package structure of the third embodiment. In the via-middle approach, the through silicon vias 16 filled with the conductor 16a are formed after formation of the electrical component 15 and a inter-layer dielectric (ILD) 18 on the front surface 14a of the substrate 11. FIG. 3 shows that the upper surface of the through silicon vias 16 is higher than that of the substrate 11. One or more electrical components 15 formed in the first device 10 (ex: formed within and/or above the substrate 11) could be the active components (such as complementary metal-oxide-semiconductor (CMOS) and others) and/or passive components.

Also, as shown in FIG. 3, a dielectric material 16L, such as oxide or nitride or their combination, could be further formed at sidewalls of the through silicon via 16 as a liner, and the conductor 16a filled in the through silicon via 16 is insulated from the substrate 11 by the dielectric material 16L. The structural details of the through silicon via 16 could be varied and modified depending on the requirements of the practical applications, and the embodiments of the disclosure are not limited to the illustrations herein.

In one example of the third embodiment, the package structure further comprises one or more ground contact vias 17 formed in the inter-layer dielectric 18, and a redistribution layer 19 formed on the inter-layer dielectric 18. Typically, the redistribution layer 19 is an extra metal layer with special pattern on a chip that makes the IO pads of an integrated circuit available in other location. In the chip with via-middle TSVs, the redistribution layer 19 is electrically connected to the conductor 16a filling in the through silicon via 16 by direct contact. Moreover, the ground contact vias 17 in the inter-layer dielectric 18 connect the electrical component 15 and the redistribution layer 19, as shown in FIG. 3; therefore, the electrical component 15 is grounded by an electrical connection of the ground contact via 17, the redistribution layer 19 and the through silicon via 16 filled with the conductor 16a.

Figure 4:
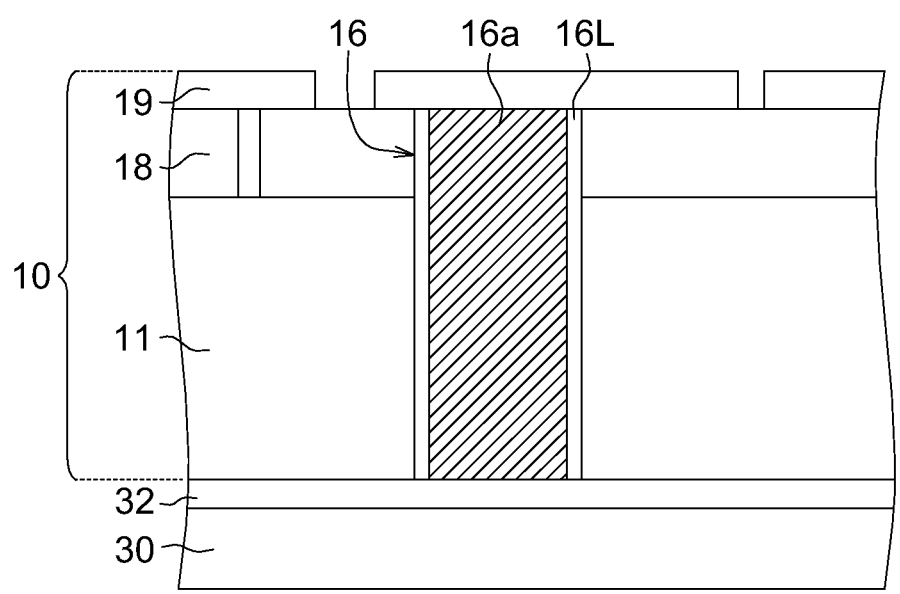
FIG. 4 schematically illustrates a portion of a package structure having another chip with via-middle TSVs according to the third embodiment of the disclosure.

For some implementations, the chip may contain no active/passive elements. One exemplified chip is provided in FIG. 4 for illustration. FIG. 4 schematically illustrates a portion of a package structure having another chip with via-middle TSVs according to the third embodiment of the disclosure. In FIG. 4, a chip with via-middle TSVs but without any electrical component is taken for exemplifying an alternative first device in the package structure of the third embodiment, which the ground contact vias 17 as depicted in FIG. 3 are omitted from the drawing. The chip as depicted in FIG. 4 would be an interposer in practical application.

Figure 5:
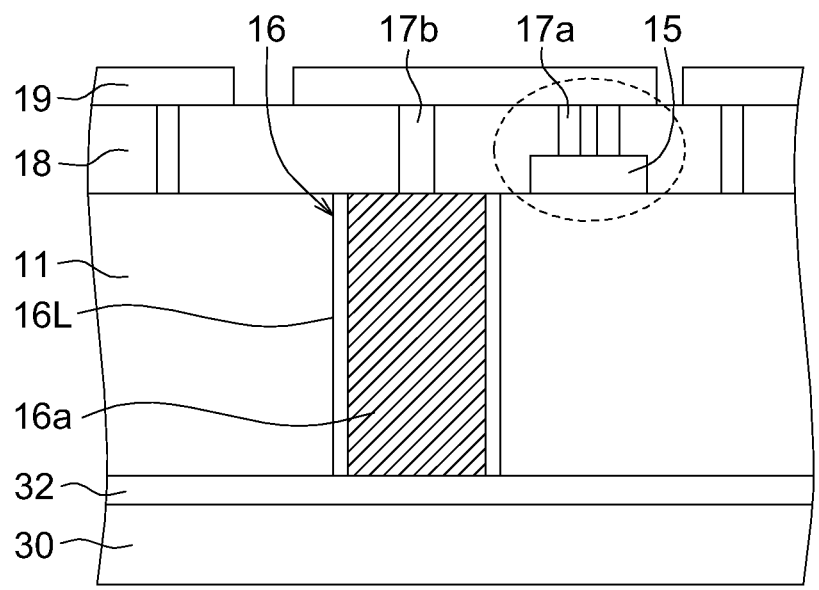
FIG. 5 schematically illustrates a portion of a package structure having a chip with via-first TSVs according to the third embodiment of the disclosure.

FIG. 5 schematically illustrates a portion of a package structure having a chip with via-first TSVs according to the third embodiment of the disclosure. In FIG. 5, a chip with via-first TSVs (fabricated by a via-first approach) is taken for exemplifying another first device in the package structure of the third embodiment. In the via-first approach, the through silicon vias 16 filled with the conductor 16a are formed before formation of the electrical component 15, and a inter-layer dielectric 18 is therefore formed on the through silicon vias 16 of the substrate 11. As shown in FIG. 5, the upper surface of the through silicon vias 16 is substantially aligned with that of the substrate 11 or slightly protrudes from the substrate 11 due to stress. Similarly, examples of the electrical component 15 include active components and/or passive components formed within and/or above the substrate 11. As shown in FIG. 5, the first device comprises the ground contact vias 17a and 17b formed in the inter-layer dielectric 18, and the redistribution layer 19 formed on the inter-layer dielectric 18, wherein the ground contact vias 17b is positioned corresponding to the through silicon vias 16. The redistribution layer 19 is electrically connected to the electrical component 15 by the ground via contact 17a, while it is electrically connected to the conductor 16a filling in the through silicon via 16 by the ground via contact 17b.

It is understood that the first devices and the second devices illustrated in the embodiments are not intended to limit the invention. The modifications and variations to the structural configurations can be made without departing from the spirit of the disclosure to meet the requirements of the practical applications.

According to the aforementioned package structure of the embodiments, a first device is electrically connected to a second device by wire bonding, and adhered to the second device 20 by a conductive adhesive disposed therebetween, wherein the first device comprises plural through silicon vias (TSV) filled with the conductor in a substrate connected to ground potential, which not only solves the problem of signal interference between long wires for conventional design, but also enhances the grounding effect, thereby improving the electrical performance of the package structure. Furthermore, methods of manufacturing the configurations of the package structures according to the embodiments are not expansive, which keeps the cost of production in an acceptable level.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
   a first device, comprising:
      a substrate, having a front surface and a back surface; and
      a plurality of through silicon vias filled with a conductor formed within the substrate;
   a second device, and the first device externally connected to the second device by wire bonding the first device to the second device; and
   a conductive adhesive disposed between the first device and the second device,
   wherein bottom surfaces of the through silicon vias are in contact with an upper surface of the conductive adhesive directly or via a conductive layer, wherein the conductive layer directly contacts the bottom surfaces of the through silicon vias and the upper surface of the conductive adhesive, and a bottom surface of the conductive adhesive directly contacts the second device.

2. The package structure according to claim 1, wherein the upper surface of the conductive adhesive is attached to the back surface of the substrate of the first device.

3. The package structure according to claim 2, wherein the conductive adhesive contacts the conductor filled in the through silicon vias.

4. The package structure according to claim 1, wherein the conductive layer is a metal layer disposed at the back surface of the substrate of the first device, and the upper surface of the conductive adhesive is disposed in contact with the metal layer.

5. The package structure according to claim 1, wherein the first device comprises a redistribution layer formed above the front surface and electrically connected to the through silicon vias filled with the conductor.

6. The package structure according to claim 5, wherein the redistribution layer is electrically connected to the conductor filling in the through silicon via by a ground via contact.

7. The package structure according to claim 6, wherein an upper surface of the through silicon via is substantially aligned with the front surface of the substrate.

8. The package structure according to claim 5, wherein the redistribution layer is electrically connected to the conductor filling in the through silicon via by direct contact.

9. The package structure according to claim 8, wherein an upper surface of the through silicon via is higher than the front surface of the substrate.

10. The package structure according to claim 8, wherein an upper surface of the through silicon via contacts the redistribution layer.

11. The package structure according to claim 1, wherein the first device further comprises at least an electrical component at the front surface of the substrate.

12. The package structure according to claim 11, wherein the first device further comprises:
   an inter-layer dielectric on the front surface;
   a redistribution layer on the dielectric layer; and
   a ground contact via formed in the inter-layer dielectric for connecting the electrical component and the redistribution layer.

13. The package structure according to claim 12, wherein the electrical component is grounded by an electrical connection of the ground contact via, the redistribution layer and the through silicon via filled with the conductor.

14. The package structure according to claim 1, wherein the through silicon vias at least penetrate the substrate and expose the back side of the substrate of the first device.

15. The package structure according to claim 1, wherein the second device is a chip, an interposer, or a printed circuit board (PCB).

16. The package structure according to claim 1, wherein the through silicon via comprises a dielectric material as a liner and the conductor filled inside.

* * * * *